US006093499A

United States Patent [19]

Tomioka

[11] Patent Number: 6,093,499

[45] Date of Patent: Jul. 25, 2000

[54] COPPER ALLOY FOILS

[75] Inventor: Yasuo Tomioka, Kanagawa-ken, Japan

[73] Assignee: Nippon Mining & Metals Co., Ltd., Tokyo, Japan

[21] Appl. No.: 09/285,853

[22] Filed: Apr. 2, 1999

[51] Int. Cl.[7] ................................ B21C 37/02; C22C 9/04

[52] U.S. Cl. .......................... 428/606; 148/413; 148/434; 360/137; 360/900; 420/469; 420/477; 420/484; 420/492; 420/495; 420/496; 428/544; 428/607; 428/469; 505/171

[58] Field of Search .................................... 428/544, 606, 428/607, 469; 148/413, 434; 420/469, 477, 484, 492, 495, 496; 360/137, 900; 505/171

[56] References Cited

U.S. PATENT DOCUMENTS 4,872,048 10/1989 Akutsu et al. .......................... 420/469

FOREIGN PATENT DOCUMENTS 10-183274 7/1998 Japan .

*Primary Examiner*—Deborah Jones
*Assistant Examiner*—Robert R. Koehler
*Attorney, Agent, or Firm*—Seidel, Gonda, Lavorgna & Monaco, PC

[57] ABSTRACT

Copper alloy foils are provided having far greater strength and heat resistance than conventional copper foils, and having better productivity, are characterized by a composition comprising, all by weight, from 0.01 to 0.4% Cr, from 0.01 to 0.25% Zr, from 0.02 to 2.0% Zn; and when necessary from 0.05 to 1.8% Fe and from 0.05 to 0.8% Ti; and when further necessary one or more elements selected from the group consisting of Ni, Sn, In, Mn, P, Mg, Al, B, As, Cd, Co, Te, Ag, and Hf in a total amount of from 0.005 to 1.5%; the balance being copper and unavoidable impurities. Inclusions in the copper foil not larger than 10 $\mu$m in size, and the inclusions between 0.5 and 10 $\mu$m in size number less than 100 pieces/mm$^2$.

8 Claims, No Drawings

COPPER ALLOY FOILS

BACKGROUND OF THE INVENTION

This invention relates to copper alloy foils with excellent strength and heat resistance, and excellent productivity. The copper alloy foils according to the invention are suited for such applications as flexible printed wiring boards and IC tape carriers, and suspensions for hard disk drives.

Flexible printed wiring boards, characterized by flexibility, can be accommodated in bent or twisted configurations in the housings of electronic equipment. In electronic appliances being made more and more compact, flexible printed wiring boards permit effective utilization of space. In addition, they can meet wiring needs for movable parts. In the field of integrated circuits, packages using tape carriers of copper foil have been employed that can be finished to finer pitches than ever to keep pace with the tendency toward thinner and shorter packages.

Flexible printed wiring boards and IC tape carriers are fabricated by laminating copper foil to a base of polyimide or other resin and applying heat and pressure, as well as adhesive to the laminate, to provide a unitary structure. The circuit boards are capable of containing etched wiring patterns as fine in pitch as 50 to 100 μm.

Further, for wiring on a suspension supporting magnetic heads of a hard disc, the instances where copper alloy foils are used instead of conventional lead wires are increasing. In such applications, higher strength copper alloy foils are required, since in head assembly, it is necessary that the foils not deform during handling. The demands of higher speed signal transfer requires higher electric conductivity.

Copper is a metal with excellent electric conductivity, and in the aforementioned field where high conductivity is a prime consideration, copper of about 99.99% purity is commonly used. However, copper has the disadvantage of markedly lowering strength and heat resistance with increased purity, and the heat applied in lamination to a flexible resin substrate of polyimide or the like can cause deformation or breakage of pure copper foil. This adversely affects the reliability of the products. Apart from considerations of thermal history during fabrication, copper foil requires heat and heat shock resistance when used in hot environments, e.g., in the engine compartment of an automobile, where the temperature is around 100° C.

On the other hand, when the thickness of copper foil in manufacturing is decreased to that of the laminate foil, difficulties in foil rolling with good yield arise. Internal defects such as inclusions, in particular, can cause rupture or pinhole generation on rolling, leading to reduced productivity and hence increased manufacturing cost. For these reasons, a copper stock with as small inclusion contents as possible is called for.

In recent years, copper alloys of the precipitation type have found increasing use in applications that demand high strength and electric conductivity, as in copper alloys for electronic equipment. Cu—Cr—Zr alloys are typical of the precipitation copper alloys that combine high strength with high conductivity, and efforts have been made to put them into practical use as materials for electronic equipment. According to research thus far made on these alloys, aging precipitation produces fine Cr and $Cu_3Zr$ particles precipitated in a copper matrix. This helps bring about increased strength and conductivity, and the size of precipitated particles which contributes to the strength increase is not more than 0.5 μm.

For example, Japanese Patent No. 2501275 (registered Mar. 13, 1996) discloses a copper alloy having both conductivity and strength. The alloy is characterized by a composition including 0.01–2 wt % chromium and/or 0.005–1 wt % zirconium, not more than 60 ppm oxygen, the balance being substantially copper, wherein precipitates not greater than 50 μm in size are present at the rate of 100–100000 pieces per square millimeter. The patent also teaches that specified amounts of Ni, Sn, Fe, Co, Zn, Ti or/and many other alloying elements may be added. However, a material containing such large precipitates on the order of 50 μm in size, numbering as many as 100–100000 pieces/$mm^2$, is not utilizable in making a rolled foil.

The phenomenon observed with the Cu—Cr—Zr copper alloys that fine Cr and $Cu_3Zr$ precipitated particles formed in the copper matrix increase the strength and conductivity is attributable to the fact that the additional elements Cr and Zr by nature can scarcely form solid solutions with copper. On the other hand, coarse crystallization or precipitation products that do not add to strength tend to remain in the matrix. Moreover, these additional elements have such high activities that they easily form oxides, sulfides, silicides, etc., with the result that a structure is easily formed in which these rather large particles are dispersed in the matrix. In fact, the above Patent No.2501275 describes that precipitates 0.5–50 μm in size were present at the high rate of 100–100000 pieces/$mm^2$.

Cu—Cr—Zr copper alloys are basically excellent copper alloys having both high strength and great electric conductivity. They are promising materials for rolled copper foils. However, an obstacle on the way to the practical use of the Cu—Cr—Zr copper alloys as copper alloy foil materials is the possibile presence of the coarse particles. The coarse particles can cause ruptures and pinholes at the time of rolling, resulting in low productivity and high manufacturing cost.

There has been a demand, therefore, for the development of Cu—Cr—Zr copper alloy foils having excellent strength, conductivity, heat resistance, and productivity suited for use in fabricating flexible printed boards, IC tape carriers and the like. Also, it is necessary to prevent separation of such copper alloy foils from bases, such as flexible printed boards, at solder-bonded portions by the heat generated during operation.

BRIEF SUMMARY OF THE INVENTION

As a result of the study of Cu—Cr—Zr copper alloys, the present inventors have now found that balancing alloy strength, electric conductivity, heat resistance, and productivity at high levels is possible by adjusting the alloy composition through the addition of Zn to Cr and Zr, and by strictly regulating and choosing the manufacturing conditions so as to control the distribution of precipitates, crystallized products, oxides, sulfides, silicides, and other inclusions in the matrix. It has also been found that a further improvement in strength properties can be achieved by the addition of Fe and Ti, and at least one element selected from the group consisting of Ni, Sn, In, Mn, P, Mg, Al, B, As, Cd, Co, Te, Ag, and Hf.

Unlike the disclosure of Japanese Patent No. 2501275, the alloys thus obtained have inclusions not larger than 10 μm in size. The number of inclusions between 0.5 and 10 μm in size is less than 100 per square millimeter. Rolled copper alloy foils suitable for use in flexible printed boards, IC tape carriers, and the like, have now been obtained for the first time in the art.

On the basis of these discoveries the invention provides copper alloy foils having far greater strength and heat resistance than conventional copper foils, and better productivity. The copper alloy foils are characterized by a composition including, all by weight, from 0.02 to 0.4% Cr, from 0.01 to 0.25% Zr, from 0.02 to 2.0% Zn, and when necessary from 0.05 to 1.8% Fe and from 0.05 to 0.8% Ti, and further when necessary one or more elements selected from the group consisting of Ni, Sn, In, Mn, P, Mg, Al, B, As, Cd, Co, Te, Ag, and Hf in a total amount of from 0.005 to 1.5%, the balance being copper and unavoidable impurities. The inclusions in the foil are not larger than 10 $\mu$m in size, and the number of inclusions between 0.5 and 10 $\mu$m in size is less than 100 per mm$^2$.

DETAILED DESCRIPTION OF THE INVENTION

For the purposes of the invention the term "inclusions" is used to encompass particles that are microscopically observed in the matrix of a copper alloy according to the invention, including the precipitates (particles) that result from precipitation reactions in the solid-phase matrix following solidification at the time of casting, i.e., in the process of cooling after solidification, during cooling after hot rolling, during the course of aging annealing, etc.; the generally coarse crystallized products (particles) that result from the segregation during the course of solidification at the time of casting; and impurities, e.g., oxides, sulfides, and silicides, that result from reactions in the molten metal during melting. The term "size of inclusions" is used to mean the diameter of the minimum of the circles that enclose the inclusions. By "number of inclusions" is meant the mean number of inclusions per unit square millimeter actually counted in many locations under microscopic observation, or the number of inclusions ranging in size from 0.5 to 50 $\mu$m counted per unit square millimeter on a mirror-polished surface of a specimen by electron-probe microanalysis (EPMA) at a magnification of 5000×.

The reasons for which the alloy composition and the size of inclusions are specified as above in accordance with the invention will now be explained.

Cr

Cr precipitates in the matrix phase upon aging of an alloy after solution treatment, and acts to increase alloy strength. If the Cr content is less than 0.02 wt %, the action is not strong enough to achieve the desired effect. Conversely if the Cr content is more than 0.4 wt %, coarse Cr inclusions remain in the same phase. This can reduce productivity due to rupture, pinhole generation, etc. at the time of rolling. For these reasons, the Cr content is limited within the range from 0.02 to 0.4 wt %.

Zr

Zr combines with Cu on aging treatment to precipitate a compound in the mother phase and reinforce it. When the Zr content is less than 0.01 wt %, no such beneficial effect is achieved. When the Zr content is more than 0.25 wt %, solution treatment leaves behind coarse Zr inclusions yet to form a solid solution, leading to a drop in productivity. Hence the Zr content is specified to be in the range of 0.01 to 0.25 wt %.

Zn

Zn is an element added to prevent the separation of soldered bonded portions from the heat generated by operation. A Zn content of less than 0.02 wt % does not produce sufficient action to attain the desired effect. A content of more than 2.0 wt % causes a marked decrease in electric conductivity. The Zn content, therefore, is specified to be between 0.02 and 2.0 wt %.

Ti & Fe

Ti and Fe are added, according to need, to form their intermetallic compound in the mother phase at the time of alloy aging treatment, so that the compound can enhance alloy strength. If the Ti and Fe content is less than 0.05 wt % each, the favorable effect by their combined action cannot be expected. If the Ti content exceeds 0.8 wt %, or the Fe content exceeds 1.8 wt %, coarse inclusions composed mainly of Ti and Fe result, to the serious detriment of productivity.

Ni, Sn, In, Mn, P, Mg, Al, B, As, Cd, Co, Te, Ag, Hf

These elements each act to enhance strength, largely through the action of solid solution strengthening without sacrificing alloy conductivity. Therefore, one or two or more of these elements are added as needed. If the total amount is smaller than 0.005 wt %, the desired effect is not obtained, but if the amount is larger than 1.5 wt %, conductivity declines seriously. Productivity is also reduce. For these reasons, the amount of Ni, Sn, In, Mn, P, Mg, Al, B, As, Cd, Co, Te, Ag, and/or Hf added singly, or added in a mixture of two or more thereof, is specified to be between 0.005 and 1.5 wt % in total.

Inclusions

Inclusion particles are often present in the matrix in the alloy system of the invention. The inclusions necessary to impart strength to the alloy are small, while coarse inclusions larger than 0.5 $\mu$m in size do not contribute to strength enhancement but can produce ruptures or pinholes upon rolling, resulting in low productivity. To avoid these effects, it is only necessary to put an upper limit of 10 $\mu$m on the size of the coarse inclusions, and to restrict the number of the inclusions between 0.5 and 10 $\mu$m in size to less than 100 pieces per square millimeter.

A manufacturing process for the alloy is described below.

Melting and Casting

During the melting process, it is essential to prevent the formation of coarse inclusions, such as of oxides, sulfides, and silicides.

Carbon is a desirable material for forming the crucible. Other materials containing oxides such as magnesia, alumina, or silica are not recommended, because molten metal can penetrate into and melt the crucible material, or the furnace material can be reduced by Zr to form a Zr oxide.

Adhesion of oily matter to the material being melted is undesirable in that the oily material can form a sulfide in the molten metal. When a return material is to be used it should be decreased in advance or, where possible, the use of such a material should be avoided.

After the material has been melted, it is necessary to either cover the molten metal surface with a reducing gas such as CO or use a vacuum atmosphere so as to decrease the oxygen concentration in the melt. It is advisable to maintain the oxygen concentration in this manner to 20 ppm or less.

Homogenizing Heat Treatment

The conditions for homogenizing heat treatment are explained as follows. Ingots contain crystallization products formed by segregation upon casting of added elements such as Cr and Zr. In order to reduce their size before the final product stage, it is important to make the crystallization products small at this stage by thorough homogenizing heat treatment prior to hot rolling. More particularly, the temperature at the point where hot rolling is started should be not lower than 800° C., preferably not lower than 850° C.

Hot Rolling

Hot rolling conditions are as follows. If the temperature drops during the course of rolling, precipitation reactions coarsen the particles. Should this happen, large particles will remain in the product in its final stage. Care must, therefore, be used to keep the temperature from dropping during hot rolling. The finishing temperature is desirably not lower than 700° C., more desirably not lower than 750° C.

In the course of cooling after hot rolling, the lower the cooling rate the faster the precipitation reaction proceeds and hence coarser the resulting particles. In such case, large particles will remain at the stage of final product. Therefore, the material temperature should not decline during hot rolling, and it is desirable that the finishing temperature is not below 700° C., preferably not below 750° C.

Solution Treatment

Solution treatment is intended to obtain high strength material after subsequent aging treatment. A high treatment temperature increases the amount of solid solution of Zr formed in the matrix and accordingly enhances the strength after aging. If these effects are to be achieved, the treatment temperature should be as high as possible, desirably not lower than 700° C. At the time of solution treatment, the higher the cooling rate the greater the strength attained. To this end, water cooling is desirable.

Cold Rolling

Cold rolling that ensues solution treatment promotes precipitation upon aging and imparts high strength. To obtain these effects, it is advisable to set the reduction ratio in cold rolling to at least 40%.

Aging Treatment

Aging treatment, a step necessary to enhance strength and electric conductivity, is performed at a temperature between 300 and 700° C. The reasons for which the particular temperature range is used are that, below 300° C., the aging treatment takes too much time to be economically justified and, above 700° C., Cr and Zr form solid solutions, which hamper the improvements in strength and conductivity which would otherwise result from age hardening.

This treatment is followed by final cold rolling and optional stress-relieving annealing.

EXAMPLES

The invention is illustrated by the following examples and comparative examples.

First, copper alloys of various compositions as shown in Table 1 were made by melting the materials, i.e., electrolytic copper or oxygen-free copper as the principal material, and copper-chromium base alloy, copper-zirconium base alloy, zinc, titanium, nickel, tin, indium, manganese, magnesium soft steel, silicon, copper-phosphorus base alloy, aluminum, boron, arsenic, cadmium, cobalt, tellurium, and silver as auxiliary materials, in vacuum or in an argon atmosphere, using carbon crucibles in a high-frequency melting furnace. The melts were cast into ingots 30 mm thick. Through the sequential steps described above, 0.035 mm-thick foils were formed from the ingots, and foil "strength", "electric conductivity", and "heat resistance" were evaluated. As for the "strength", the tensile strength of each specimen was determined by means of a tensile tester. "Electric conductivity" was measured as such. "Heat resistance" was determined as the softening temperature or the temperature at which the tensile strength of a specimen decreases in one hour of heating to a tensile strength half that before the heating.

As regard to the "number of inclusions", each specimen was mirror-polished on the surface and the number of the inclusions from 0.5 to 50 μm in size per unit square millimeter was counted by EPMA at a magnification of 5000×.

Foils measuring 0.035 mm thick, 450 mm wide, and 5000 m long each were made and tested for "productivity". The productivity ratings were obtained by considering ruptures that occurred during the course of rolling, and pinholes that were found in the products. With regard to "ruptures", the rating was ○ when no rupture occurred and x when any rupture occurred. As for "pinhole" the number of pinholes 0.5 mm or larger in diameter found per 1000 m was counted.

| | Chemical Composition (wt %) | | | | | | | | | | | |
|---|---|---|---|---|---|---|---|---|---|---|---|---|
| No. | Cr | Zr | Zn | Ti | Fe | Sn | Ni | Si | Mg | P | In | Mn |
| Example | | | | | | | | | | | | |
| 1 | 0.18 | 0.15 | 0.19 | — | — | — | — | — | — | — | — | — |
| 2 | 0.26 | 0.08 | 0.28 | — | — | 0.07 | — | — | — | — | — | — |
| 3 | 0.24 | 0.14 | 0.42 | — | — | — | 0.04 | — | — | 0.03 | — | — |
| 4 | 0.22 | 0.18 | 0.26 | — | — | — | — | 0.15 | — | — | — | 0.09 |
| 5 | 0.27 | 0.09 | 0.60 | — | — | — | — | — | 0.28 | — | — | — |
| 6 | 0.34 | 0.12 | 0.19 | — | — | — | — | — | — | — | 0.06 | — |
| 7 | 0.36 | 0.16 | 0.29 | — | — | — | — | — | — | — | — | — |
| 8 | 0.20 | 0.18 | 0.72 | 0.22 | 0.29 | — | — | — | — | — | — | — |
| 9 | 0.22 | 0.09 | 0.38 | 0.23 | 0.44 | — | — | 0.26 | — | 0.02 | — | — |
| 10 | 0.23 | 0.14 | 0.89 | 0.37 | 0.81 | 0.11 | — | — | 0.18 | — | — | 0.07 |
| Comp. Ex. | | | | | | | | | | | | |
| 11 | 0.03 | — | 0.21 | — | — | — | — | — | — | — | — | — |
| 12 | 0.67 | 0.11 | 0.31 | — | — | — | — | 0.09 | — | — | — | — |
| 13 | 0.26 | 0.14 | 2.12 | 0.31 | 0.62 | — | 1.02 | 0.21 | — | — | — | — |

-continued

| | | | | | | | | | | | | |
|---|---|---|---|---|---|---|---|---|---|---|---|---|
| 14 | 0.31 | 0.06 | 0.25 | 0.22 | 0.41 | 1.10 | 0.69 | — | — | 0.03 | — | — |
| 15 | 0.29 | 0.22 | 0.25 | 0.31 | 2.50 | — | — | — | — | 0.03 | — | — |

| | Chemical Composition (wt %) | | | | | | | | | No. of |
|---|---|---|---|---|---|---|---|---|---|---|
| No. | Al | B | As | Cd | Co | Te | Ag | O (ppm) | Cu & impurities | inclusions (/mm$^2$) |
| Example | | | | | | | | | | |
| 1 | — | — | — | — | — | — | — | 6 | bal. | 61 |
| 2 | — | — | — | — | — | — | — | 10 | " | 65 |
| 3 | — | — | — | — | 0.04 | — | — | 9 | " | 68 |
| 4 | — | — | — | — | — | — | — | 13 | " | 88 |
| 5 | — | — | 0.02 | — | — | — | 0.02 | 12 | " | 76 |
| 6 | — | — | — | — | — | 0.04 | — | 8 | " | 78 |
| 7 | 0.04 | — | — | 0.07 | — | — | — | 14 | " | 84 |
| 8 | — | — | — | — | — | — | — | 13 | " | 88 |
| 9 | — | — | — | — | — | — | — | 10 | " | 79 |
| 10 | — | 0.09 | — | — | — | — | — | 8 | " | 85 |
| Comp. Ex. | | | | | | | | | | |
| 11 | — | — | — | — | — | — | — | 7 | " | 80 |
| 12 | — | — | — | — | — | — | — | 14 | " | 120 |
| 13 | — | — | 0.02 | — | — | — | — | 8 | " | 89 |
| 14 | — | — | — | — | — | — | — | 9 | " | 133 |
| 15 | — | — | — | — | — | — | — | 13 | " | 144 |

TABLE 2

| | Results of property evaluations of alloys of the invention and comparative examples | | | | |
|---|---|---|---|---|---|
| No. | Tensile strength (N/mm$^2$) | Conductivity (% IACS) | Softening temperature (° C.) | Rupture | No. of pinhole (pc/1000 m) |
| Example | | | | | |
| 1 | 570 | 77 | 400 | ○ | 1 |
| 2 | 610 | 75 | 420 | ○ | 3 |
| 3 | 680 | 72 | 450 | ○ | 2 |
| 4 | 600 | 79 | 410 | ○ | 6 |
| 5 | 590 | 76 | 390 | ○ | 4 |
| 6 | 640 | 83 | 410 | ○ | 5 |
| 7 | 640 | 81 | 430 | ○ | 5 |
| 8 | 680 | 69 | 460 | ○ | 6 |
| 9 | 700 | 71 | 450 | ○ | 5 |
| 10 | 710 | 76 | 440 | ○ | 4 |
| Comparative Example | | | | | |
| 11 | 500 | 86 | 310 | ○ | 4 |
| 12 | 600 | 79 | 420 | x | 14 |
| 13 | 660 | 56 | 450 | ○ | 7 |
| 14 | 690 | 59 | 440 | x | 18 |
| 15 | 700 | 58 | 460 | x | 21 |

Table 2 summarizes the results of property evaluations. As can be seen from the table, the alloy foils according to the present invention possessed excellent strength, electric conductivity, heat resistance, and productivity.

In contrast, Comparative Example 11 is an example of inferior strength and heat resistance due to the absence of Zr. Comparative Examples 13 and 14 showed inferior conductivity because in the former the Zn content and in the latter the total amount of the auxiliary materials exceeded the specified ranges. Comparative Examples 12, 14, and 15 contained so many inclusions that ruptures occurred, and the number of pinholes increased during the course of manufacture.

According to the present invention, as described above, copper alloy foils superior in strength and heat resistance to conventional rolled copper foils are obtained with excellent productivity. The foils are suited for a broad range of applications including reliable base materials for flexible circuit boards and IC tape carriers.

What is claimed is:

1. A copper alloy foil consisting of, all by weight, from 0.02 to 0.4% chromium, from 0.01 to 0.25% zirconium, from 0.02 to 2.0% zinc, the balance being copper and unavoidable impurities, wherein inclusions in said foil are not larger than 10 $\mu$m in size, and the number of inclusions in the foil between 0.5 and 10 $\mu$m in size less than 100 per mm$^2$.

2. A copper alloy foil consisting of, all by weight, from 0.02 to 0.4% chromium, from 0.01 to 0.25% zirconium, from 0.02 to 2.0% zinc, one or more elements selected from the group consisting of nickel, tin, indium, manganese, phosphorus, magnesium, aluminum, boron, arsenic, cadmium, cobalt, tellurium, silver, and hafnium in a total amount of from 0.005 to 1.5%, the balance being copper and unavoidable impurities, wherein inclusions in said foil are not larger than 10 $\mu$m in size, and the number of inclusions in the foil between 0.5 and 10 $\mu$m in size is less than 100 per mm2.

3. A copper alloy foil consisting of, all by weight, from 0.02 to 0.4% chromium, from 0.01 to 0.25% zirconium, from 0.02 to 2.0% zinc, from 0.05 to 1.8% iron, from 0.05 to 0.8% titanium, the balance being copper and unavoidable impurities, wherein inclusions in said foil are not larger than 10 $\mu$m in size, and the number of inclusions in the foil between 0.5 and 10 $\mu$m in size is less than 100 per mm$^2$.

4. A copper alloy foil consisting of, all by weight, from 0.02 to 0.4% chromium, from 0.01 to 0.25% zirconium, from 0.02 to 2.0% zinc, from 0.05 to 1.8% iron, from 0.05 to 0.8% titanium, one or more elements selected from the group consisting of nickel, tin, indium, manganese, phosphorus, magnesium, aluminum, boron, arsenic, cadmium, cobalt, tellurium, silver, and hafnium in a total amount of from 0.005 to 1.5%, the balance being copper and unavoidable impurities, wherein inclusions in said foil are not larger than 10 μm in size, and the number of inclusions between 0.5 and 10 μm in size is less than 100 per $mm^2$.

5. In a suspension supporting a magnetic head of a hard disc drive, the improvement comprising wiring comprised of the copper alloy foil according to claim 1.

6. In a suspension supporting a magnetic head of a hard disc drive, the improvement comprising wiring comprised of the copper alloy foil according to claim 2.

7. In a suspension supporting a magnetic head of a hard disc drive, the improvement comprising wiring comprised of the copper alloy foil according to claim 3.

8. In a suspension supporting a magnetic head of a hard disc drive, the improvement comprising wiring comprised of the copper alloy foil according to claim 4.

* * * * *